United States Patent [19]

Bacon

[11] Patent Number: 4,864,250
[45] Date of Patent: Sep. 5, 1989

[54] DISTRIBUTED AMPLIFIER HAVING IMPROVED D.C. BIASING AND VOLTAGE STANDING WAVE RATIO PERFORMANCE

[75] Inventor: Peter Bacon, San Jose, Calif.

[73] Assignee: Harris Corporation, Melbourne, Fla.

[21] Appl. No.: 8,519

[22] Filed: Jan. 29, 1987

[51] Int. Cl.[4] ............................................. H03F 3/60
[52] U.S. Cl. .................................... 330/277; 330/54; 330/296
[58] Field of Search ..................... 330/53, 54, 57, 277, 330/286, 296

[56] References Cited

U.S. PATENT DOCUMENTS 3,218,569  11/1965  Beck ..................................... 330/54

FOREIGN PATENT DOCUMENTS 3438382  4/1986  Fed. Rep. of Germany ...... 330/286
91216    7/1980  Japan ................................. 330/277
256202   12/1985 Japan ................................. 330/286

OTHER PUBLICATIONS

Decker, "An 8 GHz MMIC Preamplifier" 1981 *IEEE MTT-S International Microwave Symposium*, Jun. 15–19, 1981, pp. 365–366.
Fujiki et al, "A12 GHz 140 K Low Noise GaAs FET Amplifier," 1980 *IEEE MTT-S Digest*, May 28–30, 1980, pp. 370–372.
Itoh et al, "12 GHz-Band Low-Noise GaAs Monolithic Amplifiers," 1983 *IEE MTT-S Digest*, pp. 54–58.
Lee, "MOSFETs Rejuvenate Old Design For CATV Broadband Amplifiers", *Electronics*, Mar. 15, 1971, pp. 72–75.
Naster et al, "Silicon-on Sapphire Monolithic Microwave ICs", 1981 *IEEE International Solid-State Circuits Conference*, Feb. 18, 1981, pp. 72–73.
Sechi, "Design Procedure For High-Efficiency Linear Microwave Power Amplifiers", IEEE Transactions On Microwave Theory and Techniques, V. MTT-28, No. 11, Nov. 1980, pp. 1157–1163.
Yokouchi et al, "4 GHz 3 Watts FET Amplifier For Digital Transmission," 1978 *IEEE MTT-S International Microwave Symposium*, Jun. 27–29, 1978, pp. 276–278.
1983 *IEEE MTT-S Digest*, pp. 70–73.

*Primary Examiner*—James B. Mullins
*Attorney, Agent, or Firm*—William A. Troner; Charles C. Krawczyk

[57] ABSTRACT

A distributed amplifier having an on chip DC biasing network including a spiral inductor. The spiral inductor has a low resistance for providing a minimal resistance path for the DC biasing, while also having a high inductance for isolating the RF signal from the DC bias sources. Additionally, an inductive lead connected between the spiral inductor and the amplifier has a predetermined inductance such that this inductance is matched with the inherent capacitance of the spiral inductor in order to provide a substantially same impedance as that of the amplifying stages.

17 Claims, 6 Drawing Sheets

DISTRIBUTED AMPLIFIER HAVING IMPROVED D.C. BIASING AND VOLTAGE STANDING WAVE RATIO PERFORMANCE

FIELD OF INVENTION

The present invention relates generally to amplifiers, and more particularly to an improved monolithic amplifier incorporating an inductive DC biasing network on the monolithic chip.

BACKGROUND OF THE INVENTION

The monolithic distributed amplifier is a "traveling wave" broadband amplifier designed to meet the increasing need for a cost effective and high reliability microwave amplifiers. The monolithic design allows for integration of the amplifier onto a single discrete chip eliminating the need for extensive tuning and wire bonding. However, the distributed amplifiers developed thus far do not incorporate the amplifier DC biasing networks on the monolithic chips themselves. To implement these off chip biasing networks, it is necessary to provide additional blocking capacitors and bond wires, thereby requiring substantial tuning of the bondwires and the capacitance values in order to achieve the desired performance. Additionally, because of the bonding requirements, DC losses from the bias sources result, thereby reducing the overall efficiency of these amplifiers. Further, the necessity of the bonding reduces the reliability of the amplifier because of the inherent defects associated with the bonding process.

In addition to the disadvantages of the prior art schemes involving off-chip DC biasing, is the concern of improving the voltage standing wave ratio (VSWR) of the distributed amplifier, while maintaining the desired frequency bandwidth. Although providing additional amplifier stages would improve the overall VSWR, the additional stages would have the effect of reducing the cut off frequency of the amplifier.

SUMMARY OF THE INVENTION

It is, therefore, an object of the present invention to provide an amplifier having the DC bias networks incorporated on the integrated chip.

It is further an object of the present invention to provide an amplifier having improved voltage standing wave ratio performance without adversely effecting the cut off frequency response of the amplifier.

It is another object of the present invention to provide an amplifier having reduced off chip bond wires and blocking capacitors.

It is still further an object of the present invention to provide an amplifier having improved performance reliability and minimal DC losses from the bias sources.

In accordance with a preferred embodiment of the invention, an amplifier is provided having the DC biasing circuits on the integrated circuit itself, thereby eliminating the variations and failures associated with off-chip biasing. A biasing circuit is provided at one or both the input and output of the amplifier for providing biasing to the same respectively.

A preferred embodiment further includes spiral inductors arranged between the respective DC bias sources and the respective input and output of the amplifier. The inductance of the spiral is designed to provide an effective open path for the frequency bandwidths desired for the amplifier, thereby isolating the frequency signal of the amplifier from the respective bias supplies. Additionally, the low resistance of the spiral inductor provides for a minimal resistive path for the DC bias current. Therefore, the losses associated with the off-chip biasing are eliminated as well as the unreliability of the additional bonding which the prior art required.

The use of the spiral inductors on the input and/or output of the amplifier also provides a significant improvement in the VSWR performance of the amplifier. The spiral inductors and the inductive lead connecting the respective spiral to the input and output have an inductance and capacitance which is substantially equivalent to that the amplifying stages and their connective leads. Adding the spirals, therefore, to the input and output adds an equivalent stage to the amplifier which improves the VSWR performance of the amplifier input and output. However, because the inductance associated with the spiral inductor is designed to provide an effective open path for the frequency of the input signal there is no reduction of the cut off frequency.

Other objects, advantages, and novel features of the present invention will become apparent from the following detailed description of the invention when considered in conjunction with the accompanying drawings.

DETAILED DESCRIPTION OF THE DRAWINGS

Figure 1:
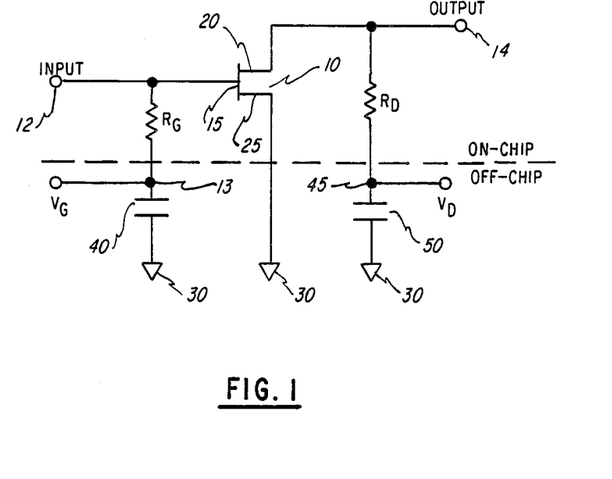
FIG. 1 is a schematic of the prior art showing a single amplifier stage with off chip DC biasing networks.

Referring to FIG. 1, a prior art hybrid circuit having a single amplifying stage is shown. A field effect device 10 (FET) is used for the amplifying stage having its gate 15 connected to the input 12 of the amplifier, its drain 20 to the output 14 and its source 25 to a ground potential 30. Distributed amplifiers typically use FET's in a common source configuration because it allows for high gain and low noise figure.

A gate terminating resistor $R_G$ for the input is arranged between the input of the amplifier and a bonding point 13 connecting to an off chip gate DC bias source $V_G$. An off chip input bypass capacitor 40 is provided between the gate DC bias $V_G$ and ground potential 30. A drain terminating resistor $R_D$ is arranged between the output of the amplifier and a second bonding point 45 connecting to an off chip drain DC bias source $V_D$. An off chip output bypass capacitor 50 is provided between the drain bias source $V_D$ and ground potential 30.

In the typical distributed amplifier using off chip biasing as shown on FIG. 1, the DC biases are brought in at points 13, 45 because they are RF ground points, provided via the respective off chip bypass capacitors. As a result, the amplifier will be insensitive to any variations in power supply impedances. As noted above, however, the prior art circuit requires tuning of the bondwires connecting the capacitors as well as the capacitors themselves in order to achieve the desired performance. Furthermore, a significant DC power loss occurs in this arrangement due to the DC bias currents having to flow through the respective terminating resistors $R_G$ and $R_D$.

Figure 2:
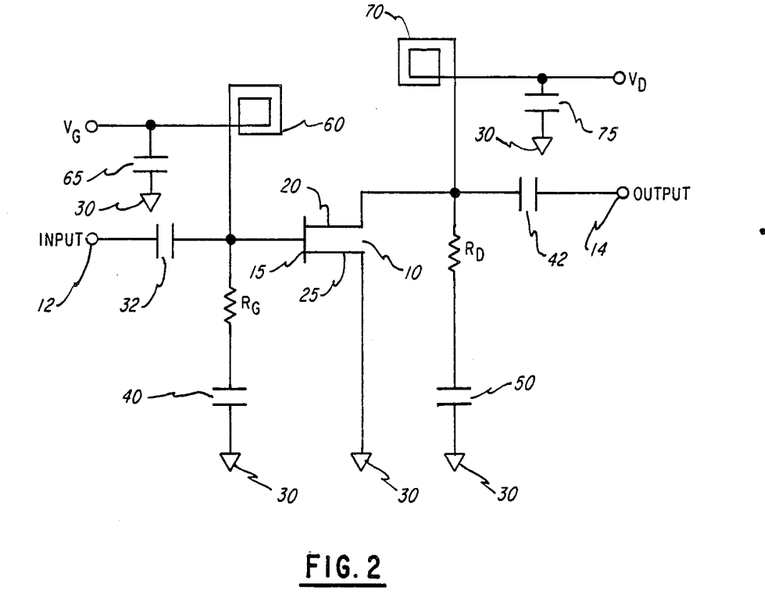
FIG. 2 is a schematic of a preferred embodiment of a amplifier circuit according to the present invention.

The preferred embodiment of the present invention as shown in FIG. 2, provides for arranging the bias circuitry to be completely on chip, thereby eliminating the adverse effects of off chip biasing. Similar to FIG. 1, a single amplifying stage comprising an FET is used, having its gate 15 connected to the amplifier input 12, its drain 20 connected the amplifier output 14, and its source 25 connected to a ground potential 30.

A gate terminating resistor $R_G$ is arranged between the amplifier input 12 via a DC blocking capacitor 32 and a ground potential 30 via a bypass capacitor 40. This resistor provides a termination for any traveling wave not propagated through the amplifying FET device, thereby avoiding degradation of the input RF signal due to interfering wave reflections. The resistance value of this resistor is chosen such that it is approximately equivalent to the characteristic impedance of the amplifier stages. Generally, this characteristic impedance is selected to be the conventional 50 ohm.

A drain terminating resistor $R_D$ is arranged between the amplifier output 14 via a DC blocking capacitor 42 and ground potential 30 via a bypass capacitor 50. Similar to the gate terminating resistor $R_G$, the drain terminating resistor provides a termination of any traveling wave reflected from the output of amplifier, thereby avoiding degradation of the output RF signal due to interfering wave reflections. The resistance value of this resistor is also chosen such that it is approximately equivalent to the output characteristic impedance of the amplifier stages, which is generally 50 ohm.

An input spiral inductor 60 has one end connected to the DC gate bias $V_G$ and the other end connected to the amplifier input 12. A bypass capacitor 65 is arranged between the DC gate bias $V_G$ and ground 30 to provide a shunt for any RF originating from the DC gate bias.

An output spiral inductor 70 has one end connected to the DC drain bias $V_D$ and the other end connected to the amplifier output 14. A bypass capacitor 75 is also arranged between the DC drain bias $V_D$ and ground 30 to provide a shunt for any RF originating from the DC drain bias.

According to the preferred embodiment of FIG. 2, the two spiral inductors 60, 70 are identical in geometry and performance, based on the assumption that both the input and output characteristic impedance of the amplifier is the preferred standard of 50 ohm. The spirals may be produced using a double metal plating process that allows the formation of cross over air bridges for connecting the respective ends. The inventor has determined through experimentation and computer analysis that optimum performance for a 6-18 GHz frequency bandwidth is attained by having a width of 16 μm for the spiral inductors and a gap of 8 μm between the conductors.

Figure 3:
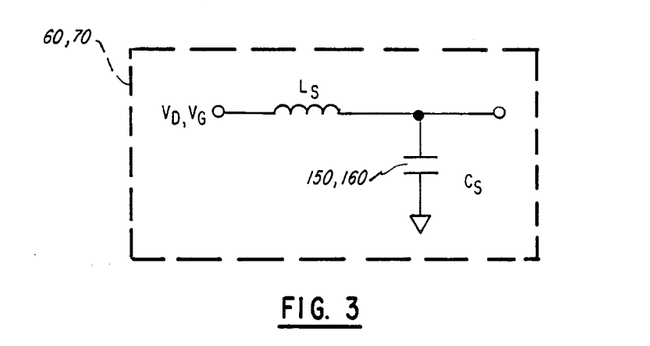
FIG. 3 is a circuit model of the spiral inductor at the input or output of the amplifier.

The spiral inductor has an equivalent model that is both inductive $L_S$ and capacitive $C_S$ as shown in FIG. 3. As discussed above, an advantage for using the spiral inductors as the path for the DC bias is the reduction in resistive losses previously caused by the drain currents passing through the drain termination resistor. The DC resistance of the spiral inductors is approximately 2 ohms resulting in a negligible loss as compared to the prior art. The gate resistive loss of the present invention is even more negligible since the current flowing through the gate terminal is in the micro-Amp range. This reduction of the thermal dissipation of resistive losses is an important consideration in the design of the distributed amplifier. This is particularly important in GaAs monolithic microwave integrated circuits (MMIC) where the small size of the MMIC and the poor thermal qualities of gallium arsenide necessitate a reduction of such heat generating losses in order to improve the total reliability of the MMIC circuit.

An additional factor of the spiral inductors is to have the inductance of the spirals large enough such that for a given frequency bandwidth, the spiral is an effective "open", thereby isolating the amplifier input and output from any variations of the power supply impedance. For frequencies in the range 6-18 GHz, this inductance is approximately 3.5 nH.

Because the spiral inductor is not an ideal open, however, bypass capacitors 65 and 75 are included at the inputs of the respective spirals for providing an RF ground.

Another significant advantage of incorporating the DC bias circuitry on the integrated circuit using spiral inductors is the resulting improvement of the VSWR performance. The improvements in the input and output matches to the 50 ohm standard increase the ability of the circuit. With improved VSWR, the circuits are easily cascaded once the interaction between circuits is minimized. The gain of each individual circuit is increased as less of the input and output power is reflected loss due to mismatching.

The distributed structure of the amplifier alternates interconnecting series inductances with the shunt capacitances of the FET's. The result ideally is an artificial transmission line having a characteristic impedance of the standard 50 ohms. This structure is best optimized for gain and VSWR by viewing the input and output networks as Chebychev passband impedance transformers. With the two termination resistors as one impedance value and 50 ohm standard as the second impedance, the artificial transmission lines perform the impedance transformation function. The nature of this transforming network is such that the more stages there are, the better the VSWR response and passband ripple. As shown in FIG. 3, the spiral inductor has a capacitance $C_S$ associated with it. This capacitance in shunt with the input and output transmission lines simulates an additional stage to the amplifier, thereby improving the VSWR of the input and output of the amplifier. As noted earlier, however, the inductance associated with the spiral is large enough to provide an "open" to the RF signal. Thus, the additional stage does not reduce the passband or gain of the amplifier even though it provides an effective additional stage for improving the VSWR performance.

Figure 4:
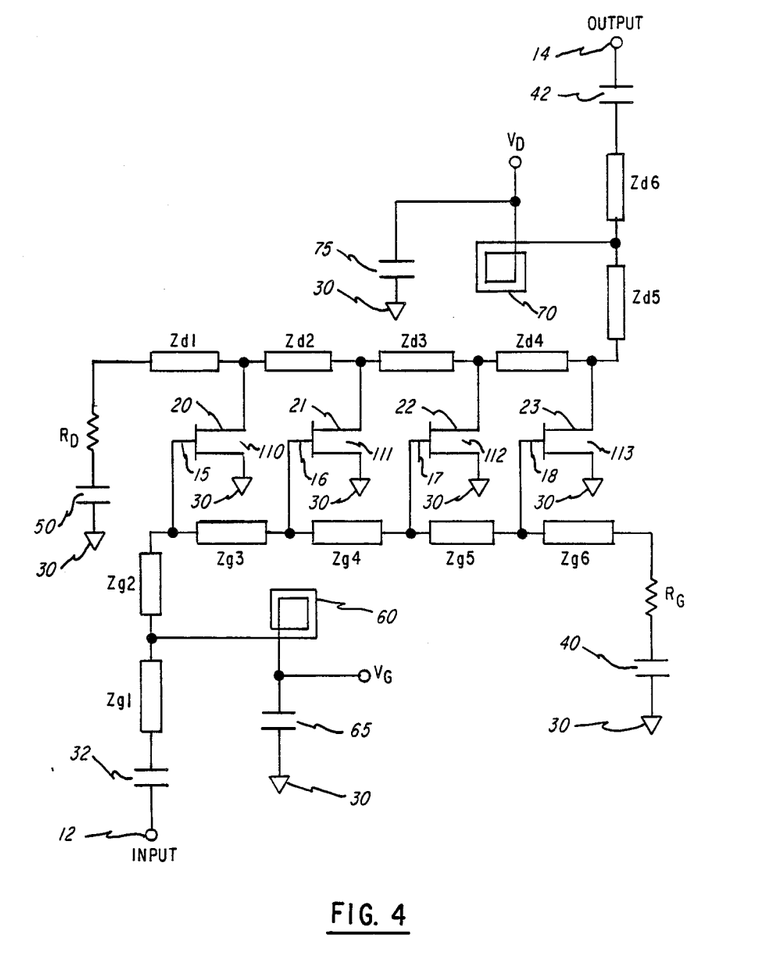
FIG. 4 is a schematic of a second preferred embodiment of a amplifier circuit incorporating four amplifying stages for providing a frequency response from 6 to 18 GHz or higher.
Figure 5:
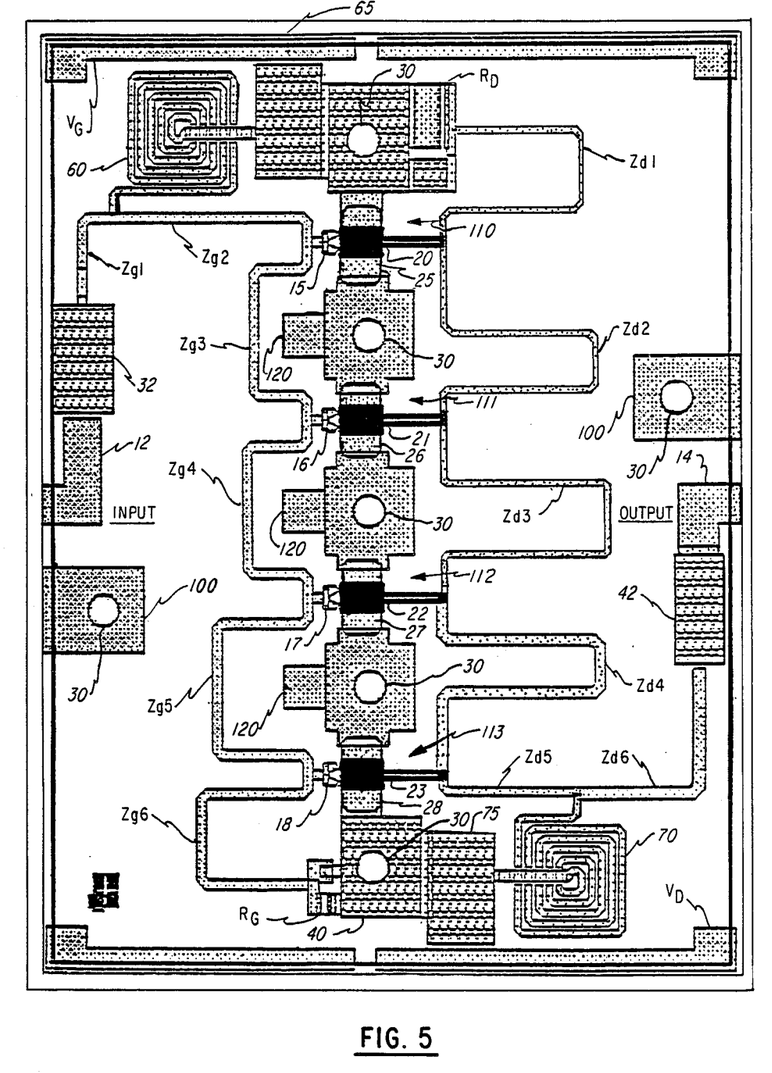
FIG. 5 is a top view of a mask layout representing the circuit of FIG. 4.

FIGS. 4 and 5 show a distributed amplifier incorporating four FET stages connected in parallel.

Theoretical formulas defining the performance of the amplifier determine that optimal performance occurs for the 6–18 GHz frequency band when four amplifying FET's are used. Although a fifth amplifying stage would further minimize the VSWR, the additional stage would also reduce the cut off frequency of the amplifier and decrease the performance.

FIG. 4 shows the effective impedances associated with the gates and drains of the respective active devices. The gates 15, 16, 17, 18 of the four FET's 110, 111, 112, 113 are all connected to the amplifier input 12 via consecutive inductive connecting lines $Z_{g2}$, $Z_{g3}$, $Z_{g4}$, $Z_{g5}$, respectively. Additionally, the gate terminating resistor $R_g$ is arranged between the fourth FET 113 via an inductive connecting line $Z_{g6}$ and a ground potential 30 via a bypass capacitor 40. The input spiral inductor 60 is connected to the amplifier input similar to that of FIG. 2 as is the DC blocking capacitor 32, the bypass capacitor 65, and gate DC bias $V_G$.

With respect to the amplifier output, the drains 20, 21, 22, 23 of the four FET's are all connected to the output 14 via consecutive inductive lines $Z_{d2}$, $Z_{d3}$, $Z_{d4}$, $Z_{d5}$ respectively. The drain terminating resistor $R_D$ is arranged between the first FET 110 via an inductive connecting line $Z_{d1}$ and ground potential 30 via a bypassing capacitor 50. The output spiral inductor 70 is also connected to the amplifier output similar to that of FIG. 2 as is the DC blocking capacitor 42, the bypass capacitor 75 and the drain DC bias $V_D$.

The input characteristic impedance of each of the FET stages is defined as the square root of the inductance divided by the square root of the capacitance of the respective FET. The capacitance and inductance is derived from the respective shunt capacitances of the FET's 110, 111, 112, 113, and the respective inductive connecting lines $Z_{g2}$-$Z_{g5}$ of the gates 15, 16, 17, 18. Likewise, the output characteristic impedance of each of the FET stages is provided by the respective shunt capacitance of the FET's and the respective inductive connecting lines $Z_{d2}$-$Z_{d5}$ to the drains 20, 21, 22, 23 of the FET's. The characteristic impedances of the input and output of each stage is adjusted to match the standard 50 ohms by varying the length and width of the inductive connecting line. The inductive connecting lines are also varied in length in order to compensate for the output of the drains such that they have the same phase and thus, the amplified signals will add constructively forming a wave increasing in amplitude as it flows to the output part.

The characteristic impedance of the spiral inductors is also matched to the standard 50 ohm impedance by adjusting the inductance of the respective connecting lines $Z_{g1}$ and $Z_{d6}$ such that the value of the inductance of the respective connecting lines divided by the value of the shunt capacitance of the respective spiral inductors equals 2500. e.g. a characteristic impedance of 50 ohms.

The capacitance of the spiral which is in shunt with the input and output transmission lines simulates the addition of a virtual fifth stage to the amplifiers. Since the capacitance value of the spiral is comparable to the parasitics of the MESFET, the simulation of the spiral as the fifth stage for both the input and output networks is a close approximation to the ideal case. The addition of the spirals, therefore, not only improves the VSWRs of the amplifier but because its inductance is large enough to be an "open" to the RF signals, there is no reduction in the bandwidth or gain of the amplifier.

The distributed amplifier of FIG. 5 has a ground plane provided by gold plating the backside of the semiconductor. The ground potential is brought to the top surface of the semiconductor for purposes of connecting to the respective sources of the active devices and the bottom plates of the capacitance through the use of via holes 30. Another feature implemented on the circuit shown in FIG. 5 are the probe pads 100 and probe pad extensions 120 for testing for RF ground to verify ground connections.

Figure 6:
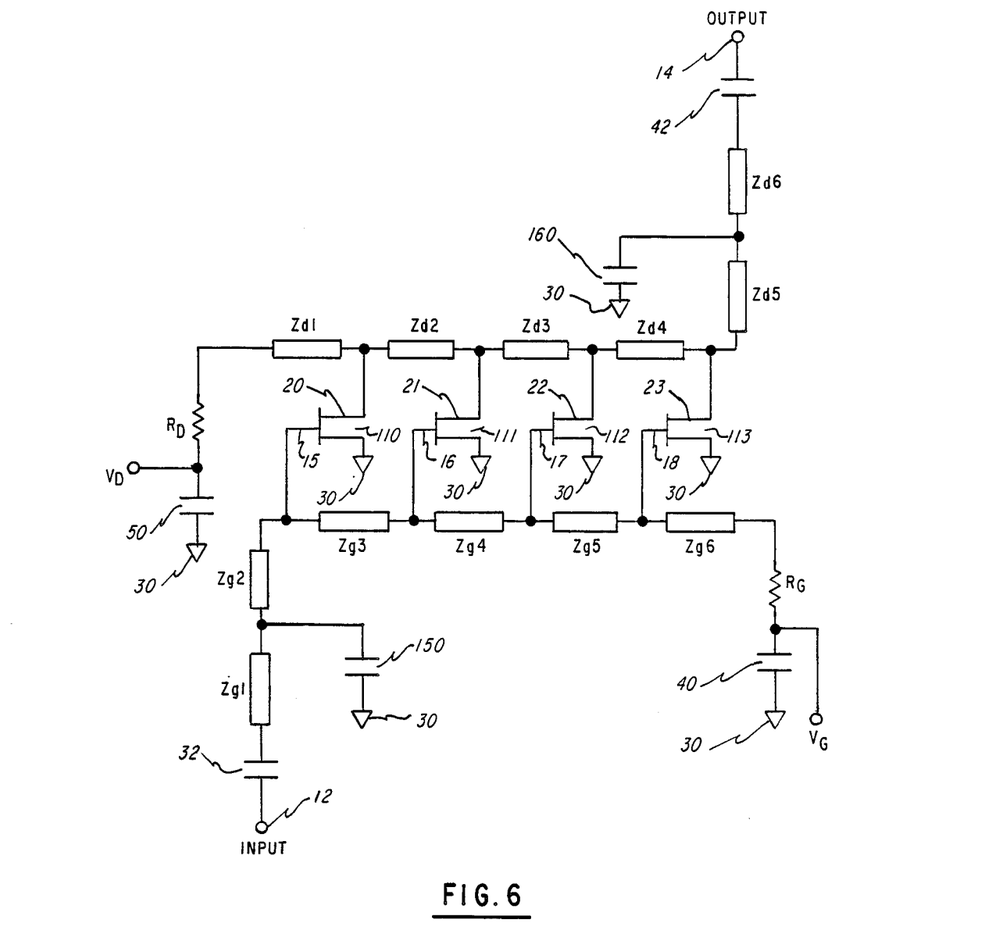
FIG. 6 is another preferred embodiment of the present invention.

Referring to FIG. 6, another embodiment of a distributed amplifier is shown, wherein the additional "virtual" stage is provided by capacitors 150 and 160 respectively shunted to ground potential 30 at the input and output. In this embodiment, the DC bias is brought in at the respective loads, thereby avoiding the need for spiral conductors. Although this design will have a certain DC loss as result of the bias signal having to flow through the load resistors $R_G$ and $R_D$, the layout area will nonetheless be conserved, in addition to still improving the VSWR as a result of the added shunt capacitance.

Figure 7:
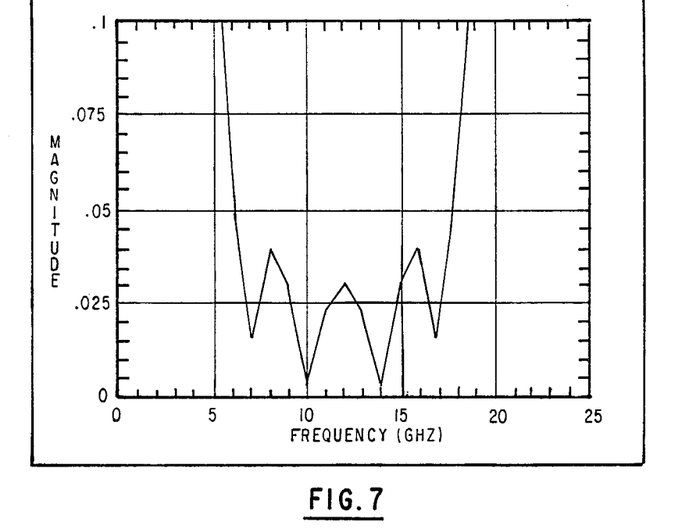
FIG. 7 is a graph of the VSWR performance of an amplifier having four amplifying stages but not incorporating the on chip spiral inductors and DC biasing.
Figure 8:
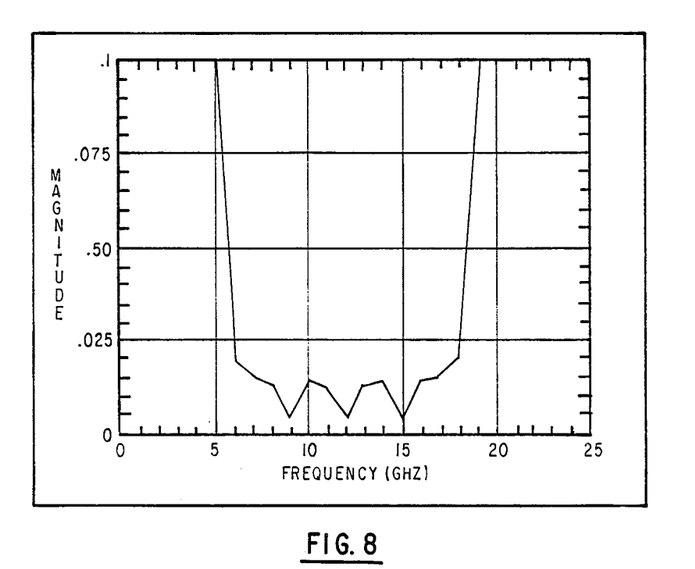
FIG. 8 is a graph of the VSWR performance of the amplifier of FIG. 4 incorporating the spiral inductors and DC biasing on the integrated chip.

FIG. 7 shows a graphical representation of an amplifiers performance which does not include on chip DC biasing or spiral inductors. FIG. 8 shows the improvements in the VSWR, of the distributed amplifier as a result of including the spiral inductors on chip.

For purposes of this application, RF is defined as any electromagnetic wave frequencies including but not limited to those frequencies in the microwave region.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. An amplifying means having an input circuit adapted for receiving electromagnetic wave signals and an output circuit, said amplifying means comprising:

at least one amplifying stage connected between said input circuit and output circuit, each amplifying stage including a predetermined input characteristic impedance and a predetermined output characteristic impedance, and an input biasing means adapted to be connected to a DC bias source, said input biasing means connected to said input circuit of said amplifying means for providing a DC bias signal to said input circuit, wherein said biasing means includes a first inductive path connected between a source of said DC bias signal and said input of said amplifying means, said first inductive path having a low resistance and a large inductance for providing a minimum resistive path for said DC bias signal from said DC bias source and a high inductive path for isolating said electromagnetic wave signals from said DC bias source, wherein said first inductive path includes a predetermined capacitance, and said input biasing means further includes a second inductive path connected between said first inductive path and said input circuit of said amplifying means, wherein an inductance associated with said second inductive path in combination with said capacitance of said first inductive path provides an effective characteristic impedance which is substantially equivalent to said predetermined input characteristic impedance.

2. The amplifying means of claim 1, wherein each amplifying stage includes a field effect device having a gate connected to said input circuit of said amplifying means, a drain connected to said output circuit of said amplifying means and a source connected to a first potential.

3. The amplifying means of claim 2, further comprising a terminating resistance means connected between said gate and said first potential, said resistance means having an effective characteristic impedance substantially equivalent to said predetermined input characteristic impedance of said amplifying stage.

4. The amplifying means of claim 3, further comprising a bypass capacitance means connected between said DC bias source and said first potential for providing a shorted path to said first potential for non DC signals originating from said DC bias source and for further isolating said electromagnetic wave signals from said DC bias source.

5. The amplifying means of claim 4, wherein said bypass capacitance means includes a first and a second metallic plate with dielectric material there between, said first plate. being coupled to said DC bias source and said first inductive path and said second plate coupled to said first potential.

6. An amplifying means having an input adapted for receiving electromagnetic wave signals and an output adapted for providing said electromagnetic wave signals, said amplifying means comprising:
   at least one amplifying stage connected between said input and output, each amplifying stage including a predetermined input characteristic impedance and a predetermined output characteristic impedance, and
   an output biasing means connected to said output of said amplifying means for providing a DC bias signal to said output, wherein said biasing means includes a first inductive path connected between a source of said DC bias signal and said output of said amplifying means, said first inductive path having a low resistance and a large inductance for providing a minimum resistive path for said DC bias signal from said DC bias source to said amplifying stage output and a high inductive path for isolating said electromagnetic wave signals from said DC bias source,
   wherein said first inductive path includes a predetermined capacitance, said output biasing means further including a second inductive path connected between said first inductive path and said output of said amplifying means, wherein an inductance associated with said second inductive path in combination with said capacitance of said first inductive path provides an effective characteristic impedance which is substantially equivalent to said predetermined output characteristic impedance.

7. The amplifying means of claim 6, wherein each of said amplifying stage includes a field effect device having a gate connected to said input of said amplifying means, a drain connected to said output of said amplifying means, and a source connected to a first potential.

8. The amplifying means of claim 7, further comprising a terminating resistance means connected between said drain and said first potential, said resistance means having an effective characteristic impedance substantially equivalent to said predetermined output characteristic impedance of said amplifying stage.

9. The amplifying means of claim 8, further comprising a bypass capacitance means connected between said DC bias source and said first potential for providing a shorted path to said first potential for non DC signals originating from said DC bias source and for further isolating said electromagnetic wave signals from such said DC bias source.

10. The amplifying means of claim 9, wherein said bypass capacitance means includes a first and a second metallic plate with dielectric material between, said first plate being coupled to said DC bias source and said first inductive path and said second plate coupled to said first potential.

11. An amplifying means having an input adapted for receiving electromagnetic wave signals and an output adapted for providing amplified electromagnetic wave signals, said amplifying means comprising:
   at least one amplifying stage connected between said input and output, each of said amplifying stages includes a predetermined input characteristic impedance and a predetermined output characteristic impedance,
   an input biasing means connected to said input of said amplifying means for providing a DC bias signal to an input of said amplifying stages, wherein said biasing means includes a first conductive path connected between a first source of said DC bias signal and said input of said amplifying means, and
   an output biasing means connected to said output of said amplifying means for providing a DC bias signal to an output of such amplifying stages wherein said biasing means includes a second conductive path connected between a second source of said DC bias signal and said input of said amplifying means,
   wherein said first and second paths have a minimum resistance for providing a low resistive path for said DC bias signals to respective inputs and outputs of said amplifying stages, and said first and second conductive paths further have a large inductance for providing a high inductive path for isolating said electromagnetic signals from the respective DC bias sources,
   wherein said first and second conductive paths have a first and second predetermined capacitance respectively, sad input biasing means further including a third conductive path connected between said first conductive path and said input of said amplifying means and said output biasing means further including a fourth conductive path connected between said second conductive path and said output of said amplifying means, wherein an inductance associated with said third conductive path in combination with said first capacitance of said first conductive path provides an effective characteristic impedance which is substantially equivalent to said predetermined input characteristic impedance, and wherein an inductance associated with said fourth conductive path in combination with said second capacitance of second conductive path provide an effective characteristic impedance which is substantially equivalent to said predetermined output characteristic impedance.

12. An amplifying means having an input adapted for receiving electromagnetic wave signals, and an output adapted for providing amplified electromagnetic wave signals corresponding to said received signals, said amplifying means comprising:

a plurality of amplifier stages connected in parallel, each stage including a field effect transistor having a gate connected to said input of said amplifying means, a drain connected to said output of said amplifying means and a source connected to a first potential, wherein said gates of said transistors are connected consecutively to each other via a first inductive connecting line, and a first of said consecutively connected transistors has its gate being coupled to said input f said amplifying means via a second inductive connecting line, wherein each amplifying stage includes a substantially same predetermined input characteristic impedance, wherein said drains of said transistors are connected consecutively to each other via a third inductive connecting line, and a last of said consecutively connected transistors has its drain being coupled to said output of said amplifying means via a fourth inductive connecting line, wherein each amplifying stage includes a substantially same predetermine output characteristic impedance, a first inductive. spiral connected between said input of said amplifying means and a first bias means, said bias means providing for a DC gate bias signal, said spiral having a first predetermined inductance sufficiently large such that it inhibits propagation of said electromagnetic wave signals from said input of said amplifying means to said first bus means, wherein said first inductive spiral also has a first minimum resistance for providing a low resistance path for said DC gate bias signal from said first bus means to said respective gates of said transistors, a first inductive connecting means connected between said first inductive spiral and said input of said amplifying means, said inductive means includes a selected inductance, wherein said inductive means and a capacitance of said first inductive spiral are adjusted to provide an effective characteristic impedance substantially equivalent to said predetermined input characteristic impedance of said amplifying stage.

13. The distributed amplifying means of claim 12, wherein each of said transistors includes a predetermined shunt capacitance, and each of said first connecting inductive lines includes a selected inductance for each gate wherein the value of said selected inductance of said first inductive lines divided by the value of the respective said shunt capacitance is substantially equivalent to the square of the value of said predetermined input characteristic impedance.

14. The distributed amplifying means of claim 13, further comprising a terminating resistor connected between said first potential and said gate of the last consecutive transistor, said resistor having an impedance substantially equivalent to said input characteristic impedance.

15. The distributed amplifying means of claim 14, further comprising a bypassing capacitor connected between said first bus means and said first potential.

16. The distributed amplifying means of claim 15, further comprising a second inductive spiral connected between said output of said amplifying means and a second bus means, said second bus means providing a DC drain bias signal, said second inductive spiral having a second predetermined inductance sufficiently large such that it inhibits propagation of said electromagnetic wave signals from said output of said amplifying means to said second bus means wherein said second inductive spiral also has a second minimum resistance for providing a low resistance path for said DC drain bias signal to travel from said second bus means to said respective drains of said transistors.

17. The distributed amplifying means of claim 16, further comprising a second inductive means connected between said second inductive spiral and said output of said amplifying means, said inductive means includes a selected inductance, wherein said second inductive means and a capacitance of second inductive spiral together provide an effective characteristic impedance substantially equivalent to said predetermined input characteristic impedance of said amplifying stage.

* * * * *